United States Patent [19]
Rosenfield et al.

[11] Patent Number: 4,752,668
[45] Date of Patent: Jun. 21, 1988

[54] SYSTEM FOR LASER REMOVAL OF EXCESS MATERIAL FROM A SEMICONDUCTOR WAFER

[76] Inventors: Michael G. Rosenfield, 104 North Street, #503, Stamford, Conn. 06902; David E. Seeger, 130 Sleepy Hollows Rd., Congers, N.Y. 10920

[21] Appl. No.: 856,303
[22] Filed: Apr. 28, 1986
[51] Int. Cl.⁴ ............................................. B23K 26/16
[52] U.S. Cl. ........................ 219/121 LH; 219/121 LJ; 219/121 FS; 219/121 LY
[58] Field of Search ....... 219/121 H, 121 LJ, 121 FS, 219/121 LR, 121 LY, 121 LA, 121 LB; 356/401

[56] References Cited
U.S. PATENT DOCUMENTS 3,569,660  3/1971  Houldcroft ............... 219/121 FS X
3,866,398  2/1975  Vernon, Jr. et al. ..... 219/121 FS X
4,370,175  1/1983  Levatter ........................... 219/121 L
4,414,059  11/1983  Blum et al. ............... 219/121 LH X
4,504,726  3/1985  Hosaka et al. ................ 219/121 LH
4,532,401  7/1985  Shiozaki et al. .......... 219/121 FS X
4,564,739  7/1986  Mattelin ........................ 219/121 LH
4,577,958  3/1986  Phillips ........................... 356/401 X Primary Examiner—C. L. Albritton
Attorney, Agent, or Firm—Sughrue, Mion, Zinn, Macpeak & Seas

[57] ABSTRACT

A system for removing excess material from a semiconductor wafer employs an excimer laser for ablative photocomposition. A wafer is positioned on an X-Y stage that is computer controlled to position the wafer at points where the laser may be focused to remove excess material whether over alignment marks or identified contamination. The laser passes through a vacuum chamber which by generating an inward laminar flow constrains any particulate contamination resulting from the ablative photodecomposition from spreading. This material is removed by the vacuum system.

19 Claims, 1 Drawing Sheet

SYSTEM FOR LASER REMOVAL OF EXCESS MATERIAL FROM A SEMICONDUCTOR WAFER

BACKGROUND OF THE INVENTION

1. Technical Field

This invention relates to systems for processing of semiconductor wafers. In particular, this invention is directed to a technique for removing excess resist material on a semiconductor wafer surface.

2. Prior Art

In the manufacture of semiconductor wafers, a resist is commonly applied in blanket form and then exposed, developed and selectively removed for purposes of patterning various areas on the wafer. Frequently, the resist itself remains over alignment marks which are provided in peripheral portions of the wafers and within the chips themselves. Additionally, during device processing, residual portions of the resist may exist, that is not fully removed. The presence of resist over alignment marks introduces complications and errors in detection of those points which in turn leads to alignment errors in the fabrication of integrated circuit devices. In the case of excess material existing on the active area of the wafer, such contaminant may lower yield output of the manufacturing process and frequently introduce additional cleaning and inspection steps which are expensive and time-consuming.

Current manufacturing techniques may employ separate discrete processing steps to remove the resist over the alignment marks and then continue processing. Generally, this removal step is chemically oriented. However, depending on the resist which is used, chemical processing may or may not be achievable. For example, use of a negative photo resist precludes chemical processing since such processing would render all of the resist useless for further processing.

Moreover, the thickness of the resist over, alignment marks is significant as a function of a lithographic system which is used. For example, in the case of E-beam lithography using a 25 kv accelerating voltage, resist thickness in the range of 3-4 microns will prevent the E-beam from returning through the resist from the alignment marks. In the case of optical alignment systems, the resist presents problems in viewing for purposes of achieving accurate alignment. Thus, in any given processing scheme the problem of having usable alignment marks exists. However, no system approach is known to expose such marks by removing overlying resist while not further contaminating the structure.

Within the prior art, there is a recognition that lasers may be used for purposes of performing scribing, cutting, or like task. Typical is U.S. Pat. No. 3,742,183 which illustrates a laser cutter having a scoop connected to a suction pipe for purposes of removing by-products of the laser burning process. Laser machining for purposes of boring holes, scribing or the like, is disclosed in U.S. Pat. Nos. 4,032,743, 4,078,165 and 4,267,427.

Reference is made to U.S. Pat. Nos. 3,991,296 and 4,114,018 which are directed to ablative techniques employing lasers and formation of grooves in a semiconductor wafer by the use of a laser beam. While such technology recognizes a myriad of uses of lasers, none is specifically directed to the removal of a resist over alignment marks and to the removal of excess material existing on a semiconductor substrate.

Within the laser scribing technology, a myriad of systems also exist which incorporate suction techniques to remove entrained gases, vaporized materials or the like which are generated as a by-product of laser processing. U.S. Pat. No. 3,866,398 illustrates the use of a laser directed onto a silicon slice to be scribed. The laser is directed through a mirror which is placed on a scavenging system in alignment with the slice or kerf to be generated in the silicon wafer. The scavenging system includes a hood having a vacuum port. Perforated tubing is used to introduce a reagent gas which combines with the high thermal energy gaseous silicon to form a gaseous silicon component which is drawn out of the chamber through the vacuum system.

U.S. Pat. No. 4,347,785 also employs a vacuum chamber for purposes of removing plasma and debris which are formed as a consequence of laser scribing.

Less relevant is U.S. Pat. No. 3,524,038 which discloses use of an adjacent vacuum to remove debris created during cutting of metal and an analogous system in IBM TDB, Vol. 14, No. 3, page 709, August 1971 vis-a-vis scribing of a silicon wafer.

Thus, while the prior art is replete with a number of schemes employing laser technology to achieve scribing or cutting, none are uniquely suited for the removal of resist material which may exist over an alignment mark or, the removal of discrete areas of resist which constitutes excess material on a semiconductor wafer surface. A key problem is the inability in the prior art to define a system that removes material covering alignment marks without damaging the alignment marks themselves. Another problem is that the laser removal of resist requires ablative photodecomposition.

The use of a excimer laser to remove resist by ablative photodecomposition has been proposed in R. Srinivasan et al, *J. Am. Chem. Soc.*, 104, 6784 (1982). However, the use of such a laser to remove resist introduces another problem, the removal of the resulting particulate contaminants. The mere use of a vacuum to remove particulate contaminants will generally be ineffective unless some technique to prevent spreading at the point of ablative decomposition is employed. None of the prior art identified here are capable of such containment.

SUMMARY OF THE INVENTION

Given the deficiencies in the prior art, it is an object of this invention to define a system which employs an excimer laser for the removal of excess material from a semiconductor wafer. The excess material may exist over alignment marks or a discrete location on the wafer surface.

In accordance with this invention, a wafer is mounted on an X-Y stage which is controlled by an appropriate microcomputer. The excimer laser beam is focused and directed in a bore-sight manner into a vacuum chamber which is disposed in close proximity to the material to be removed. By the application of a vacuum, laminar lines of flow exist around the area to be removed by ablative photodecomposition. Those inward lines of flow completely contain any particulate contamination which will be produced such that it is swept away by the vacuum.

Further, in accordance with this invention, the microcomputer is used to move the stage from one point containing excess material to another and achieve proper alignment with the laser. By control of a shutter, the beam is directed to the site of interest and the material removed. The microcomputer then moves the stage to the next site and the processing continues.

Consequently, in accordance with this invention, excess material is removed on an on-line basis during the fabrication process without damaging the wafer including the alignment marks. In the case of resist over alignment marks, the invention provides for accurate alignment in each stage in the process. In the case of residual material, such is removed on a real-time basis as ablative photodecomposition occurs. Accordingly, device yields increase since inspection on a step-by-step basis allows for the removal of contaminants. Such should be contrasted with present techniques where inspection and testing does not occur until the device is completed and covered with its protective passivation layer.

This invention will be described in greater detail by referring to the attached drawing and the description of the preferred embodiment that follows.

DESCRIPTION OF THE PREFERRED EMBODIMENT

Figure 1:
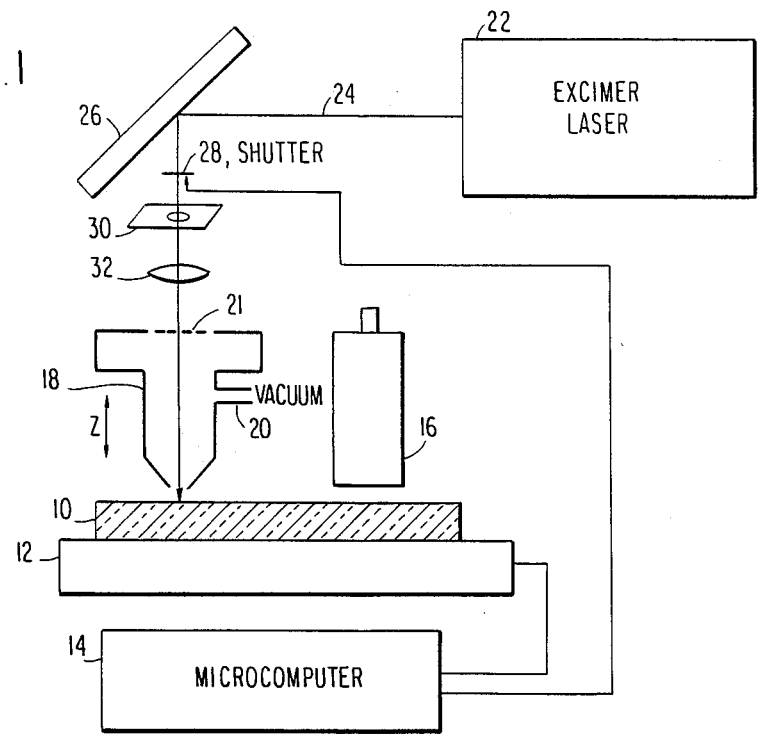
FIG. 1 is a schematic view illustrating the essential components of this invention.

Referring now to FIG. 1, the essential aspects of this invention are illustrated. A semiconductor wafer 10 is mounted on an X-Y stage 12. Such stages are well known in the art and include vacuum hold-down techniques to accurately maintain registration of the wafer 10 with the stage 12. The stage is movable in the X and Y direction under the control of a microcomputer 14. A typical microcomputer is an IBM-PC suitably programmed to receive data concerning the coordinate locations of alignment marks or debris on the wafer and generating the necessary outputs to move the stage 10 relative to a known coordinate system. The use of microcomputer to drive such an X-Y stage is well known to those skilled in the art. An optical alignment microscope alignment microscope 16 is employed for purposes of prepositioning the wafer 10 on the stage 12. That is, simple global alignment is employed utilizing the optics 16 to remove any rotation of the wafer 10 vis-a-vis the stage 12. This is done by viewing the alignment marks through the optics 16 and rotating the wafer into a proper position or by using the micro computer 14 to remove the rotational error by X-Y movement.

A vacuum chamber 18 is positioned above the stage 12. The vacuum chamber is movable in the Z direction utilizing a mechanical micropositioner. Vacuum chamber 18 is coupled to a vacuum source via a conduit 20 and has at its upper end a window 2 to allow the laser beam to pass and impinge on the wafer 10. Alternatively, Z-axis movement may be controlled using a laser height sensor controlled by computer 14 to optimize the Z-axis distance.

The laser source is an excimer laser 22. The beam 24 is reflected by a mirror 26 through a shutter 28. The shutter is controlled by the microcomputer 14. When opened, the shutter allows the laser beam 24 to pass through a mask 30 and a condenser lens 32. The beam is, therefore, shaped and focused onto the surface of the wafer 10. Alternatively, the mask will be eliminated and the nozzle 19 is employed as a proximity mask.

Figure 2:
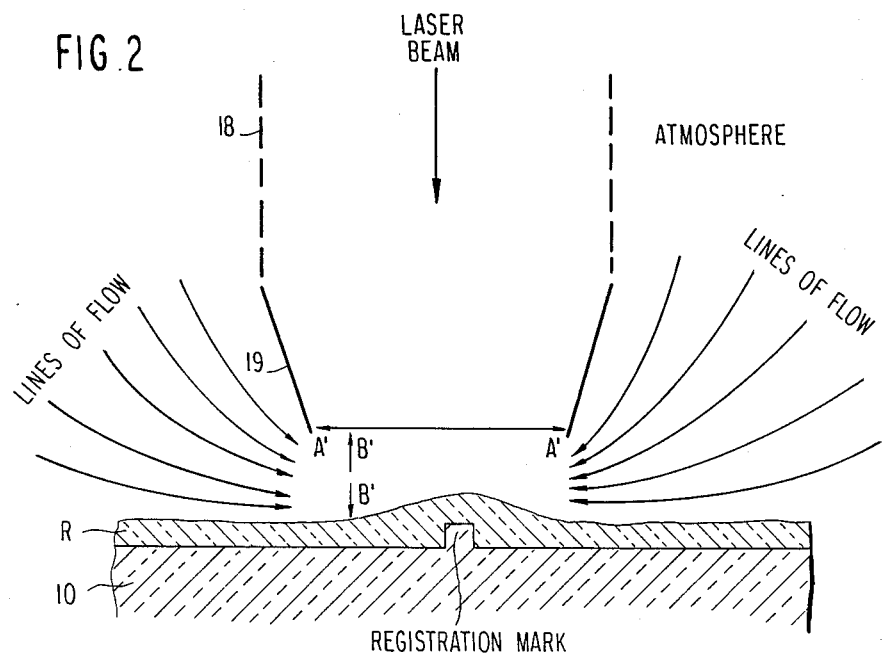
FIG. 2 is a schematic view illustrating the nozzle and the laminar lines of flow which are employed for the removal of particulate contamination.

Referring now to FIG. 2, an enlarged partial section of the system of FIG. 1 is depicted. The vacuum chamber 18 terminates in a nozzle section 19. The lower tapered portion of the nozzle has a diameter A'—A' in the range of 50–500 microns. The nozzle size is a function of the area to be ablated. By the use of the micropositioner, the lower end of the nozzle 19 is maintained at a predetermined distance above the resist R. The dimension illustrated as B'—B' is in the range of 20–100 microns or at such height that debris is contained and the nozzle does not strike the stage during nozzle movement.

FIG. 2 illustrates a registration mark on the semiconductor wafer covered by the resist R. Such registration marks are about typically about 1–2 microns wide and about 30–100 microns long. Some times the registration marks are clustered at corners of the wafer, but for purposes of explanation only a simple cross-section is illustrated.

In accordance with this invention, laminar lines of flow are induced, given the reduced pressure inside of the nozzle 19. Thus, a uniform inward laminar flow is directed along upper surface of the resist R throughout the dimension B'—B' and contains any particulate contamination which exists by the removal of excess resist over the registration mark. This containment of contamination is an important aspect of this invention. It has been experimentally confirmed that at a pressure ratio greater than 1:2 (outside:inside), the laminar flow existing between the end of the nozzle 19 and the top surface of the resist R approaches the velocity of Mach 1. This effectively constrains any debris from escaping outside the nozzle.

In operation, the wafer 10 is positioned at a predetermined location on the stage 12. To the extent that any rotational inaccuracy exists, such is removed by means of rotation using the alignment optics 16 and/or the microcomputer 14. The microcomputer receives the data indicating the location of registration marks on the wafer 10. In the case of excess material at locations other than the alignment marks, automatic defect detection devices are employed to first digitize the location of such material and provide coordinates as input to the microcomputer 14. The vacuum chamber 8 is positioned in the Z-axis at a predetermined height and the vacuum system 20 is actuated.

The excimer laser 22 is then turned on and the control by the microcomputer 14 the shutter 28 is cycled. Following removal of resist at one location by ablative photodecomposition, the shutter 28 is closed and the stage moved to the next coordinate location. The shutter is then opened and the excimer laser beam removes resist at the second site. The iteration continues until all material is removed from the wafer surface. At each step of removal of material, the existence of laminar flow at the nozzle opening continuously prevents escape of the particulate contamination.

For example, for PMMA resist a power/pulse of 80 mj/cm$^2$ will remove approximately 0.05$\mu$/pulse of material. For a novolac resin at the same power approximately 0.04$\mu$/pulse will be removed.

While this invention has been described relative to the use of vacuum pump coupled to the chamber 18, other techniques may be employed. For example, a differentially pumped vacuum system may be used. That differentially pumped vacuum would be especially useable in a system wherein the laser beam 24 is horizontally scanned, by movement of the mirror 26, either alone or in combination with movements of the stage, for purposes of stepping across the wafer 10. In the context of horizontal laser scan, the beam may not be actually centered within the chamber 18. Consequently, using a series of concentric nozzles each pumped to a different vacuum level, actual alignment of the beam within the chamber 18 is not mandatory. Typically, in such a modification, the axially outer vacuum would be greater than succeeding intervacuum conditions. The effective diameter of innermost nozzle can be increased to incorporate sufficient range of laser scanning in the horizontal plane.

Thus, it can be appreciated that this invention finds application in improving level-to-level registration alignment and overlay in optical, electron beam, and X-ray lithographic systems. This is achieved by the effective on-line removal of resist which covers registration marks. Moreover, in the context of removal of excess material which may exist anywhere on the laser surface, by prior identification and digitizing of those locations, device yields improve dramatically as processing continues.

It is apparent that modifications of this invention may be practiced without departing from the central scope thereof.

We claim:

1. A system for removing excess material from a semiconductor wafer comprising:
    an X-Y stage for supporting said wafer;
    a vacuum chamber disposed above said wafer and movable vertically with respect to said stage to maintain said chamber at a controlled distance from said wafer;
    an excimer laser;
    means to focus a beam from said excimer laser through said vacuum chamber onto said wafer; and
    means to move said stage such that said laser is positioned to remove said excess material by ablative photodecomposition and said vacuum removes any resulting particulate contamination.

2. The system of claim 1 further comprising computer means to control movement of said stage.

3. The system of claim 2 further comprising a shutter blocking said beam, and said computer means controlling said shutter.

4. The system of claim 1, wherein said means to focus comprises a mirror to direct said beam from said excimer laser onto said wafer, a mask and, a condenser lens to focus said beam onto said wafer.

5. The system of claim 1, wherein said vacuum chamber includes a window for optically passing said beam and, a converging nozzle proximate to the surface of said wafer such that a zone of laminar flow is created around the excess material to sweep particulate contamination into said nozzle.

6. The system of claim 1, wherein said vacuum chamber is maintained at a controlled distance of 20–100 microns above said wafer.

7. The system of claim 5, wherein said vacuum chamber nozzle has a diameter of in the range of 50–500 microns.

8. The system of claim 1 further comprising alignment optics to optically sight said wafer for determining any rotational misalignment of said wafer.

9. The system of claim 1, wherein said vacuum chamber is maintained at a distance above said wafer to contain debris and said nozzle does not strike said stage.

10. A method of removing excess material from a semiconductor wafer comprising:
    supporting said wafer on a horizontally movable stage;
    positioning a vacuum chamber above said wafer;
    actuating an excimer laser and directing a beam through said vacuum chamber onto said excess material for removal thereof by ablative photodecomposition; and
    removing any contamination by vacuum action while preventing any spread thereof by inward laminar airflow toward said vacuum chamber, wherein said excess material comprises a photoresist material that can be ablated without damaging the underlying substrate.

11. A method of removing excess material from a semiconductor wafer comprising:
    supporting said wafer on a horizontally movable stage;
    positioning a vacuum chamber above said wafer;
    actuating an excimer laser and directing a beam through said vacuum chamber onto said excess material for removal thereof by ablative photodecomposition;
    removing any contamination by vacuum action while preventing any spread thereof by inward laminar airflow toward said vacuum chamber; and
    moving said stage and actuating said laser to remove excess material at a position removed from the location of excess material first removed.

12. The method of claim 11, wherein said excess material comprises a photoresist material then can be ablated without damaging the underlying substrate.

13. The method of claim 12, wherein said photoresist covers alignment marks on said wafer.

14. The method of claim 10 further comprising the steps of moving said stage and actuating said laser to remove excess material at a position removed from the location of excess material first removed.

15. The method of claim 10 further comprising the step of moving said vacuum chamber vertically with respect to said wafer.

16. The method of claim 15, wherein said vacuum chamber is maintained at a distance of 20–100 microns above said wafer.

17. The method of claim 11, wherein said excess material is ablated without damaging the wafer.

18. The method of claim 15, wherein said vacuum chamber is maintained at a distance such that debris is contained and vacuum chamber does not contact said stage.

19. A method of removing excess material from a semiconductor wafer comprising:
    supporting said wafer on a horizontally movable stage;
    moving a vacuum chamber vertically with respect to said wafer to position said vacuum chamber above said wafer at a distance of 20–100 microns above said wafer;
    actuating an excimer laser and directing a beam through said vacuum chamber onto said excess material for removal thereof by ablative photodecomposition; and
    removing any contamination by vacuum action while preventing any spread thereof by inward laminar airflow toward said vacuum chamber.

* * * * *

UNITED STATES PATENT AND TRADEMARK OFFICE
CERTIFICATE OF CORRECTION

PATENT NO. : 4,752,668

DATED : June 21, 1988

INVENTOR(S) : ROSENFELD et al

It is certified that error appears in the above-identified patent and that said Letters Patent is hereby corrected as shown below: On the title page Insert -- [73] Assignee   International Business Machines Corporation, Armonk, New York --.

Signed and Sealed this

Eleventh Day of October, 1988

Attest:

DONALD J. QUIGG

*Attesting Officer*     Commissioner of Patents and Trademarks